United States Patent
Oda

(10) Patent No.: US 10,431,918 B2
(45) Date of Patent: Oct. 1, 2019

(54) ELECTRICAL CONTACT TERMINAL AND ELECTRONIC COMPONENT SOCKET

(71) Applicant: ENPLAS CORPORATION, Kawaguchi-shi, Saitama (JP)

(72) Inventor: Takahiro Oda, Kawaguchi (JP)

(73) Assignee: ENPLAS CORPORATION, Kawaguchi-shi, Saitama (JP)

( * ) Notice: Subject to any disclaimer, the term of this patent is extended or adjusted under 35 U.S.C. 154(b) by 0 days.

(21) Appl. No.: 15/755,040

(22) PCT Filed: Aug. 16, 2016

(86) PCT No.: PCT/JP2016/073875
§ 371 (c)(1),
(2) Date: Feb. 23, 2018

(87) PCT Pub. No.: WO2017/033795
PCT Pub. Date: Mar. 2, 2017

(65) Prior Publication Data
US 2018/0241142 A1    Aug. 23, 2018

(30) Foreign Application Priority Data

Aug. 25, 2015  (JP) .................................. 2015-166276

(51) Int. Cl.
*H01R 13/03*   (2006.01)
*G01R 1/04*   (2006.01)
(Continued)

(52) U.S. Cl.
CPC ........... *H01R 13/03* (2013.01); *C23C 14/025* (2013.01); *C25D 5/12* (2013.01); *C25D 5/50* (2013.01);
(Continued)

(58) Field of Classification Search
CPC .... C25D 7/00; C25D 5/50; C25D 5/12; C23C 14/025; G01R 31/2875; G01R 1/0458; G01R 1/06761; H01R 13/03
(Continued)

(56) References Cited

U.S. PATENT DOCUMENTS

2010/0163276 A1\*  7/2010  Yamaguchi .............. C25D 5/12
                                                                  174/126.2
2011/0214900 A1     9/2011  Hirano et al.
(Continued)

FOREIGN PATENT DOCUMENTS

CN          104204296        12/2014
CN          104205508        12/2014
(Continued)

OTHER PUBLICATIONS

"Kyoto University Developed Alloy Having the Same Property as Rhodium," retrieved from URL: http://www.nikkei.com/article/DGXNASFK2302H_T20C14A1000000/, The Nihon Keizai Shimbun (newspaper), (Jan. 24, 2014), 2 pages.
(Continued)

*Primary Examiner* — Dao H Nguyen
(74) *Attorney, Agent, or Firm* — Morgan, Lewis & Bockius LLP

(57) ABSTRACT

Contact pins are provided to a socket main body for accommodating an IC package so as to be in contact with connection terminals of the IC package accommodated in the socket main body. Each contact pin includes a conductive substrate and multiple layers laminated on the surface of the substrate, including: an underlying layer formed on the substrate by Ni plating; a first surface layer formed on the underlying layer by Pd—Ni alloy plating; a second surface layer formed on the first surface layer by Ni plating, thus allowing Sn from the corresponding connection terminal to
(Continued)

diffuse into the second surface layer at a rate lower than into a conventional plated Ag layer; and an outermost surface layer formed on the second surface layer by Au plating to serve as an electrical contact layer.

16 Claims, 12 Drawing Sheets

(51) Int. Cl.
G01R 31/28 (2006.01)
C25D 5/12 (2006.01)
C23C 14/02 (2006.01)
C25D 5/50 (2006.01)
C25D 7/00 (2006.01)
G01R 1/067 (2006.01)

(52) U.S. Cl.
CPC ............. *C25D 7/00* (2013.01); *G01R 1/0458* (2013.01); *G01R 31/2875* (2013.01); *G01R 1/06761* (2013.01); *H01R 2201/20* (2013.01)

(58) Field of Classification Search
USPC ........ 257/690, 666, 750, 703, 767, E23.028, 257/E23.054, E23.06, E23.069; 439/887
See application file for complete search history.

(56) References Cited

U.S. PATENT DOCUMENTS

| | | | |
|---|---|---|---|
| 2013/0222005 A1 | 8/2013 | Hirano et al. | |
| 2015/0171537 A1* | 6/2015 | Shibuya | C25D 5/10 361/773 |
| 2015/0194746 A1* | 7/2015 | Shibuya | C25D 5/12 439/887 |
| 2015/0295333 A1* | 10/2015 | Shibuya | C25D 5/10 439/887 |

FOREIGN PATENT DOCUMENTS

| | | |
|---|---|---|
| JP | 2004-192861 A | 7/2004 |
| JP | 2011-095254 | 5/2011 |
| JP | 2012-112680 | 6/2012 |
| JP | 2013-221166 A | 10/2013 |
| JP | 2014-182976 A | 9/2014 |
| WO | WO 2014/148365 | 9/2014 |

OTHER PUBLICATIONS

International Preliminary Report on Patentability from PCT/JP2016/073875, dated Mar. 8, 2018, 13 pages.

Gedeon, "Nickel as undercoating," Retrieved from URL: https://materion.com/-/media/files/alloy/newsleters/technical-tidbits/issue-no-36---nickel-as-an-undercoating.pdf, Dec. 31, 2011, 2 pages.

Extended European Search Report dated Mar. 26, 2019, from European Patent Application No. 16839142.3, 11 pages.

Chinese Office Action from 201680049251.6, dated Apr. 28, 2019, and its partial English language translation, 7 pages.

Japanese Office Action from Japanese Patent Application No. 2015-166276, 5 pages including partial English language translation.

* cited by examiner

ELECTRICAL CONTACT TERMINAL AND ELECTRONIC COMPONENT SOCKET

TECHNICAL FIELD

The present invention relates to an electrical contact terminal for electrically connecting an electronic component to a wiring board, and to an electronic component socket which includes the electrical contact terminal, and which is secured onto the wiring board with the electronic component detachably accommodated therein.

BACKGROUND ART

As a conventional electronic component socket, there is an IC socket which accommodates an electronic component such as an integrated circuit (IC) package for conducting a performance test such as a burn-in test on the IC package. Such a conventional IC socket includes contact pins each having a plated metal surface as electrical contact terminals for electrically connecting the IC package to a wiring board. The IC package includes connection terminals to be in electrical contact with the contact pins of the IC socket. In some IC packages, each connection terminal is formed using what is called a "lead-free solder" which contains tin as a principal ingredient but no lead.

Recently, an IC package has been required to withstand usage environments involving higher temperature conditions such as in a control unit located in an engine compartment. In line with this trend, the test temperatures set in burn-in tests also tend to be higher (150° C. or higher, for example). When a burn-in test is conducted at a higher test temperature, tin contained in each connection terminal of the IC package dissolves and diffuses with higher rate into the metal plating layer formed on the surface of the corresponding contact pin of the IC socket, thus forming an alloy along the interface with higher rate. Here, when the IC package is taken out of the IC socket with the connection terminal adhered to the contact pin, fracture occurs in such an alloy layer formed along the interface between the plated metal layer of the contact pin and the connection terminal of the IC package, and the plated metal layer partially peels off with the connection terminal. Thus, when the test temperature becomes higher and the rate of alloying increases, an alloy layer is formed at a higher rate and the plated metal layer is reduced more quickly.

In a known solution for this, for each contact pin, a plated palladium-nickel alloy layer is formed on a plated nickel layer that serves as the underlying layer, and a plated Ag layer, in which tin diffuses more slowly than in the plated palladium-nickel alloy layer, is formed on the outer side of the plated palladium-nickel alloy layer so as to serve as the outermost surface layer (see Patent Document 1, for example).

In such a contact pin, when tin contained in each connection terminal of the IC package dissolves and diffuses into the plated metal layer of the corresponding contact pin, only an extremely thin silver-tin alloy layer is formed at an initial stage along the interface between the plated metal layer of the contact pin and the connection terminal of the IC package. Accordingly, such a contact pin can minimize the portion of the plated silver layer that peels off with the connection terminal of the IC package when the IC package is taken out of the IC socket. This delays diffusion of tin into the plated palladium-nickel alloy layer, located further inside, thus reducing the rate of reduction of the plated palladium-nickel alloy layer that is caused when the plated palladium-nickel alloy layer is partially alloyed with tin and peels off with the connection terminal of the IC package.

REFERENCE DOCUMENT LIST

Patent Document 1: JP 2014-182976 A

SUMMARY OF THE INVENTION

Problem to be Solved by the Invention

However, when the test temperature set in performance tests is even higher (200° C. or higher, for example), the silver-tin alloy layer is formed at a higher rate along the interface between the plated metal layer of the contact pin and the connection terminal of the IC package. Thus, a larger portion of the plated silver layer of the IC package is likely to peel off with the connection terminal. The plated silver layer delays diffusion of Sn into the plated palladium-nickel alloy layer. Accordingly, faster reduction of the plated silver layer causes faster diffusion of Sn into the plated palladium-nickel alloy layer. As a result, the plated palladium-nickel alloy layer tends to reduce more quickly, and the underlying plated Ni layer may be exposed sooner.

For this, it is conceivable to greatly increase the thickness of the plated silver layer so as to make the contact pin usable for a greater number of tests until the plated silver layer is completely removed. However, such a solution is not preferable since it affects the size of the contact pin, thus affecting its fitting to the IC socket.

To address the above problems, the present invention has been made to provide an electrical contact terminal that is usable for a greater number of performance tests conducted on electronic components at higher test temperatures until the underlying layer is exposed while avoiding large increases in the thickness of surface plating, and to provide an electronic component socket including such electrical contact terminals.

Means for Solving the Problem

To solve the problems, an electrical contact terminal according to the present invention includes a conductive substrate and a plurality of layers laminated on a surface of the substrate, wherein the plurality of layers include: a first surface layer that contains palladium or a palladium alloy as a principal ingredient; and a second surface layer formed on an opposite side of the first surface layer from the substrate, the second surface layer containing, as a principal ingredient, nickel or a nickel alloy that is alloyable with tin and allows dissolution and diffusion of tin therein upon application of heat at a diffusion rate of tin which is lower than that in silver or in the first surface layer.

The electrical contact terminal as described above may further include an underlying layer formed between the substrate and the first surface layer, the underlying layer containing nickel as a principal ingredient; and a third surface layer formed between the underlying layer and the first surface layer, the third surface layer containing a material that is alloyable with tin and allows dissolution and diffusion of tin therein upon application of heat at a diffusion rate of tin which is lower than that in nickel. The third surface layer may contain, as a principal ingredient, any one of rhodium, chromium, ruthenium, indium, and an alloy with palladium and ruthenium, for example.

The electrical contact terminal as described above may further include an outermost surface layer formed on an opposite side of the second surface layer from the first surface layer. The outermost surface layer contains an electrical contact material that includes gold, silver, or palladium as a principal ingredient.

An electronic component socket according to the present invention includes: a socket main body for accommodating an electronic component including a connection terminal that contains tin; and an electrical contact terminal as described above that is provided to the socket main body so as to be in contact with the connection terminal of the electronic component accommodated in the socket main body.

Effects of the Invention

When used for performance tests conducted on electronic components at higher test temperatures, the electrical contact terminal and electronic component socket according to the present invention are usable for a greater number of the performance tests until the underlying layer is exposed even though the electrical contact terminal has a limited plated surface thickness.

MODES FOR CARRYING OUT THE INVENTION

Embodiments of the present invention will be described below with reference to the accompanying drawings. FIGS. 1 to 8 exemplify an electrical contact terminal according to a first embodiment of the present invention and an electronic component socket using such electrical contact terminals.

The electronic component socket includes a socket main body and electrical contact terminals. The socket main body is secured onto a wiring board with an electronic component, such as an IC package, detachably accommodated therein. The electrical contact terminals electrically connect the electronic component to the wiring board. For example, the electronic component socket may be an IC socket for conducting a performance test such as a burn-in test on an IC package. The IC socket includes contact pins as electrical contact terminals for electrically connecting the IC package to the wiring board.

Figure 1:
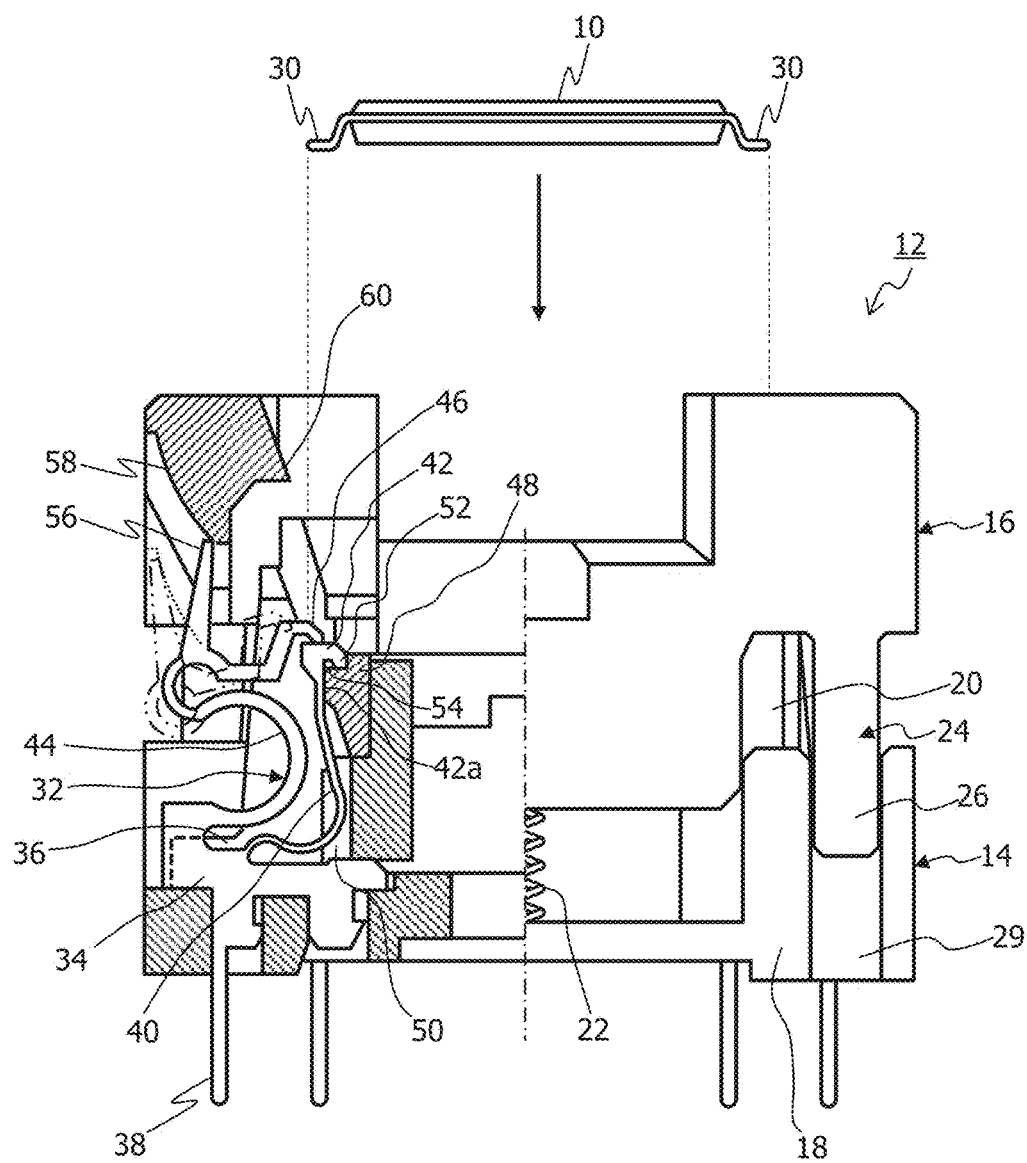
FIG. 1 is a partial cross-sectional view of the electronic component socket according to a first embodiment of the present invention as viewed from the front.
Figure 2:
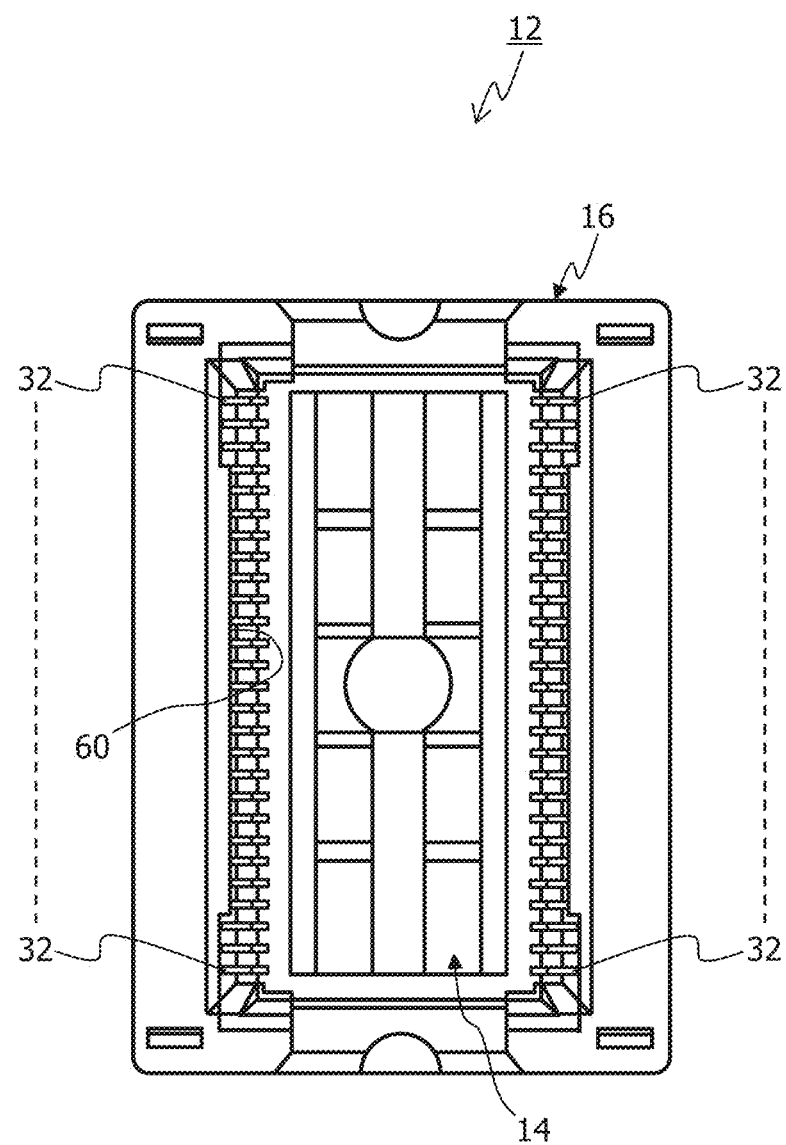
FIG. 2 is a plan view of the electronic component socket according to the first embodiment.

In FIG. 1, an IC socket 12 is an electronic component socket for accommodating an electronic component such as an IC package 10, and includes a socket main body 14 and a cover 16.

The socket main body 14 includes a cover guide 18 formed so as to facilitate vertical move of the cover 16. The cover 16 includes a guide groove 20 formed so as to slidably engage with the cover guide 18. The cover 16 is guided by the cover guide 18 of the socket main body 14 to move vertically. The socket main body 14 and cover 16 are made of an electrically insulating resin material.

The cover 16 is assembled to the socket main body 14 so as to compress coil springs 22 disposed between the socket main body 14 and the cover 16 by a predetermined amount. The cover 16 is constantly biased upwardly from the socket main body 14 by the coil springs 22. The vertical position of the cover 16 is governed by a stopper 24 (see FIGS. 1 and 4). At least one pair of the coil springs 22 are disposed and arranged in the right-left direction of FIG. 4.

Figure 4:
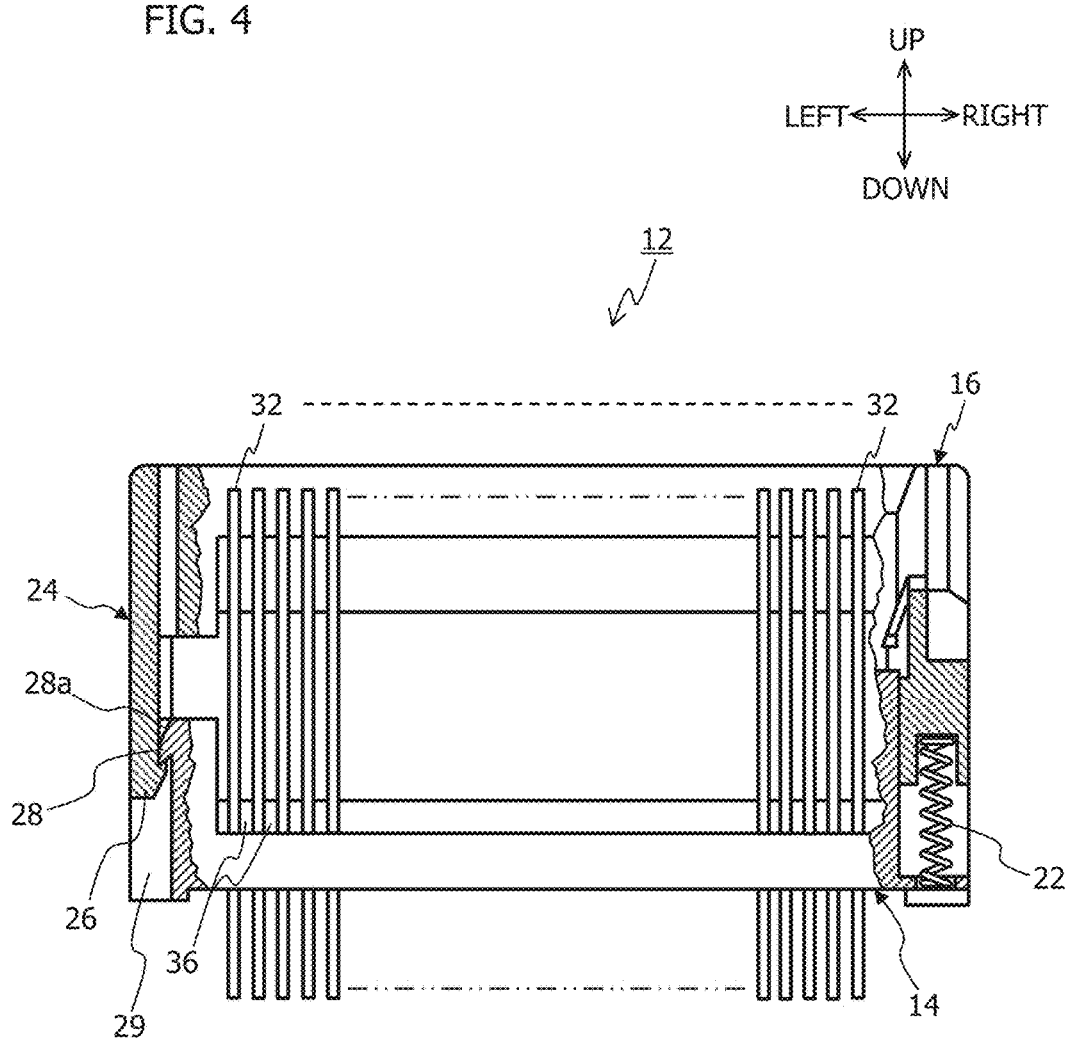
FIG. 4 is a partial cross-sectional view of the electronic component socket according to the first embodiment as viewed from the side.

As shown, in particular, in FIG. 4, the stopper 24 includes claws 26 formed at the four corners of the cover 16, and claws 28 of the socket main body 14 adapted to engage with the claws 26. The claws 26 of the cover 16 are slidably engaged in grooves 29 that are formed in the socket main body 14. When the cover 16 is pushed down, the claws 26 are elastically deformed outwardly along inclined surfaces 28a of the claws 28 of the socket main body 14 to climb over the claws 28 of the socket main body 14, so that the claws 26 are then engaged with the claws 28 of the socket main body 14. In this way, the cover 16 is assembled to the socket main body 14.

A plurality of contact pins 32 are disposed in the socket main body 14 as electrical contact terminals for electrically connecting connection terminals 30 of the IC package 10 to an electrical circuit (not shown) that is formed in an external wiring board. Each connection terminal 30 is formed using what is called a "lead-free solder" which contains tin (Sn) as a principal ingredient but no lead (Pb).

As shown, for example, in FIG. 1, the contact pins 32 are fixed at their base portions 34 to the socket main body 14 by, for example, press fitting. The contact pins 32 are separated by ribs 36 formed in the socket main body 14 to ensure that each contact pin 32 will not be in contact with other adjacent contact pins 32. Each contact pin 32 has a connection arm 38, which projects from the base portion 34 toward below the socket main body 14. The connection arms 38 are electrically connected to the electrical circuit (not shown) that is formed in the external wiring board.

As shown, for example, in FIG. 1, each contact pin 32 has a first contact portion 42 and a second contact portion 46. The first contact portion 42 is connected to the base portion 34 by a first spring portion 40, which has an inverted C-shape. The second contact portion 46 is connected to the base portion 34 by a second spring portion 44, which has an S-shape.

Figure 3:
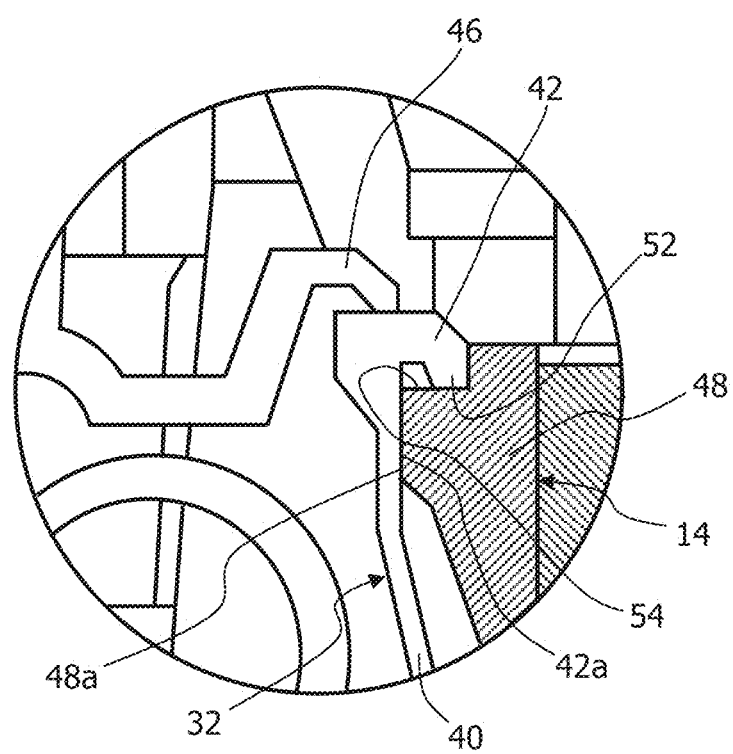
FIG. 3 is a partial enlarged view of each electrical contact terminal provided to the electronic component socket according to the first embodiment.
Figure 5:
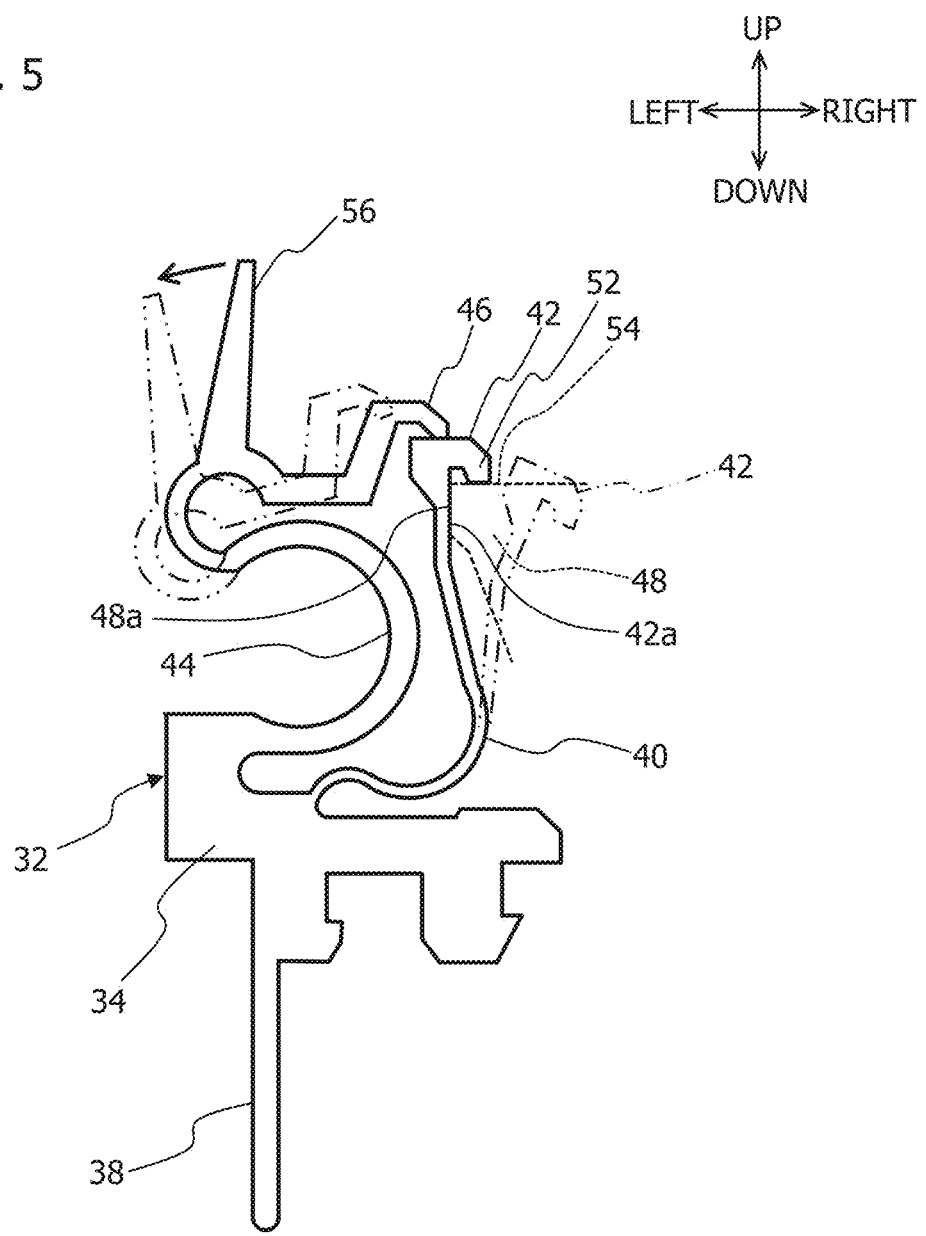
FIG. 5 is a diagram for illustrating a first operation state of the electrical contact terminal according to the first embodiment.

The first contact portion 42 is moved from the position indicated by two-dot chain line to the position indicated by solid line in FIG. 5 with the first spring portion 40 elastically deformed, so as to be fitted into an engaging groove 50 in a pin support block 48 of the socket main body 14. A positioning step portion 52 is formed in the first contact portion 42. As shown in FIG. 3, by an elastic force of the first spring portion 40, the positioning step portion 52 is pressed against a positioning engaging portion 54 formed in the pin support block 48 of the socket main body 14. As a result, vertical positioning of the first contact portion 42 is achieved. Furthermore, by the elastic force of the first spring portion 40, a lower-end side surface 42a of the first contact portion 42 is pressed against a side end surface 48a of the pin support block 48. As a result, horizontal positioning of the first contact portion 42 is achieved.

Each contact pin 32 is formed such that the second contact portion 46 is positioned as follows before the cover 16 is pressed down against the spring forces of the coil springs 22. Specifically, in this state, the second contact portion 46 is located close to the top of the first contact portion 42 within a distance corresponding to the thickness of each connection terminal 30 of the IC package 10, or the spring force of the second spring portion 44 presses the second contact portion 46 against the first contact portion 42 from above.

As shown in FIGS. 1 and 5, the second spring portion 44 has an arm 56, which is formed at an upper end portion of the second spring portion 44 so as to protrude in the upward direction of each of FIGS. 1 and 5. When the cover 16 is pressed down against the spring forces of the coil springs 22, the arm 56 is pressed by a pressing inclined surface portion 58 that is formed in the cover 16 so as to have a circular arc-shaped cross section. This moves the arm 56 counter-clockwise to the position indicated by two-dot chain line of each of FIGS. 1 and 5 as well as elastically deforms the second spring portion 44. As a result, the second contact portion 46 is retracted from the position located above the first contact portion 42.

Figure 6:
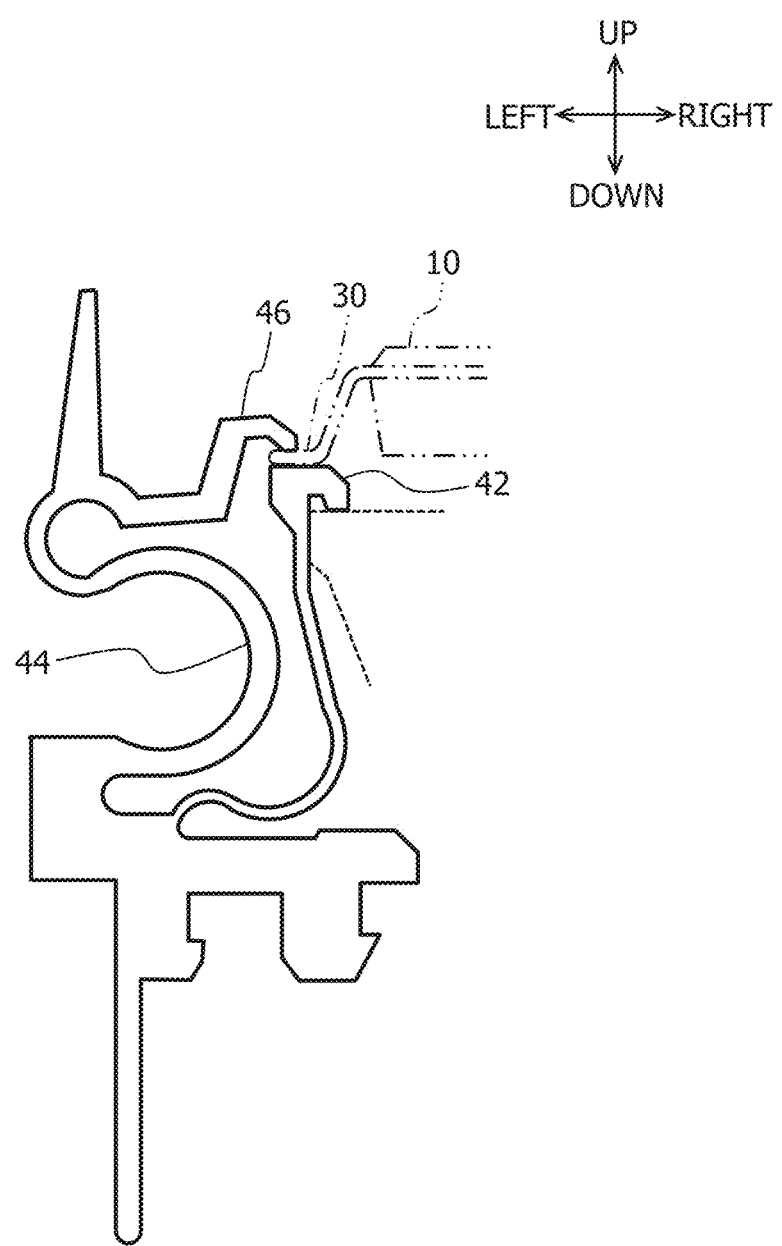
FIG. 6 is a diagram for illustrating a second operation state of the electrical contact terminal according to the first embodiment.

In the state in which the cover 16 is pressed down against the spring forces of the coil springs 22, the IC package 10 is inserted through the cover 16 from an IC package insertion slot 60 that is formed in the cover 16, so that the IC package 10 is accommodated in the socket main body 14. As a result, the connection terminals 30 of the IC package 10 are brought into contact with the upper surfaces of the first contact portions 42 on a one-to-one basis. Then, when the pressing-down force having applied on the cover 16 is released, the spring forces of the coil springs 22 move the cover 16 back to its original position. Accordingly, the arm 56 moves clockwise along the pressing inclined surface portion 58 from the position indicated by two-dot chain line of each of FIGS. 1 and 5. As a result, as shown in FIG. 6, by means of the elastic force of the second spring portion 44, the second contact portion 46 presses the corresponding connection terminal 30 of the IC package 10 onto the upper surface of the first contact portion 42. Thus, the connection terminal 30 of the IC package 10 is clamped by the first and second contact portions 42, 46 with a predetermined contact pressure. In this way, the IC package 10 is electrically connected to the electrical circuit (not shown) that is formed in the external wiring board by way of the contact pins 32. In such a state, a performance test such as a burn-in test is conducted on the IC package 10.

When the performance test is completed, the cover 16 is pressed down against the spring forces of the coil springs 22. This causes the pressing inclined surface portion 58 of the cover 16 to press the arms 56, and elastically deforms the second spring portions 44. As a result, each second contact portion 46 is retracted from the position located above the corresponding connection terminal 30 to the position indicated by two-dot chain line of each of FIGS. 1 and 5. After that, the IC package 10 is taken out of the cover 16 through the IC package insertion slot 60, and the next performance test can then be conducted on another IC package 10.

Figure 7:
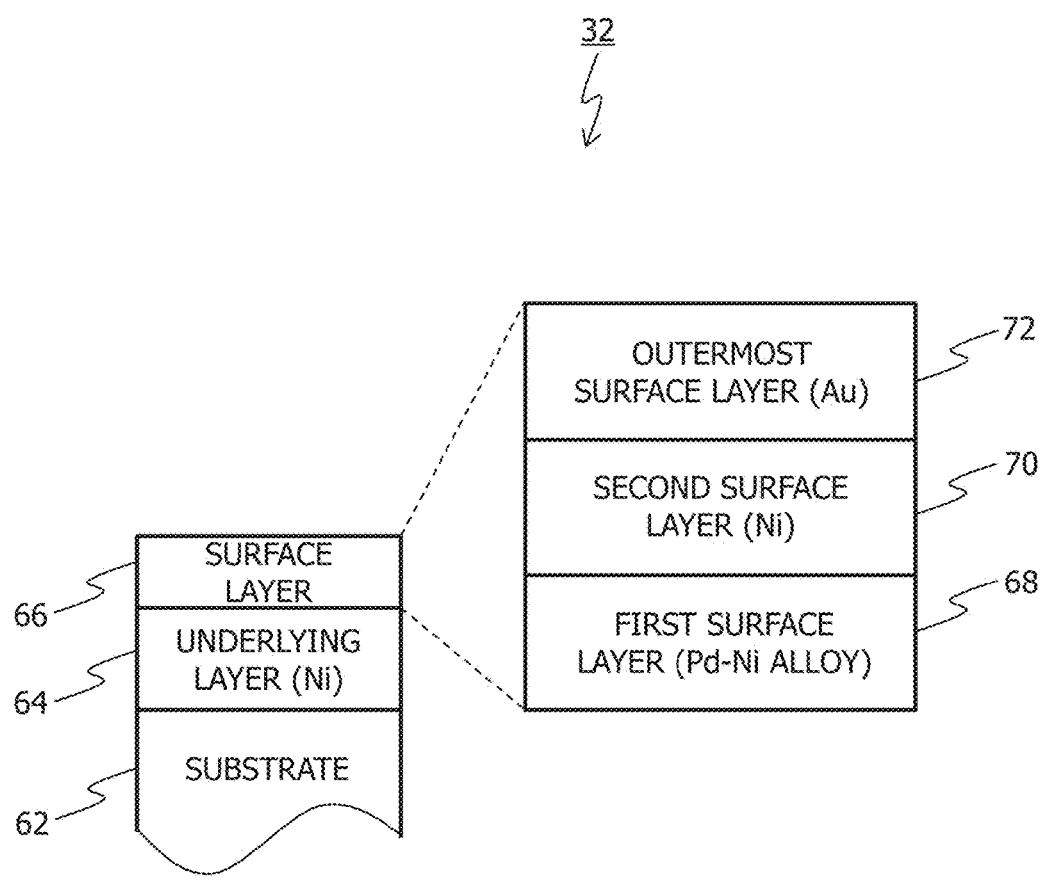
FIG. 7 is a schematic for illustrating the layer structure of the electrical contact terminal according to the first embodiment.

Next, materials of the contact pins 32 will be described. Each contact pin 32, which has a layer structure as shown in FIG. 7, includes a substrate 62, an underlying layer 64, and a surface layer 66. The underlying layer 64 is laminated on the surface of the substrate and the surface layer 66 is laminated on the outer side of the underlying layer 64.

The substrate 62 is made of a conductive material. In consideration of the need for the contact pin 32 to be elastic, the substrate 62 is made of a beryllium copper (Be—Cu) alloy in this embodiment, for example. The underlying layer 64 is formed with a thickness of 2 to 3 μm by nickel (Ni) plating, for example. Note that, materials for the substrate 62 and underlying layer 64 are not limited to the above, and they may be made of other suitably selected materials.

The surface layer 66 includes at least two laminated layers. In this embodiment, the surface layer 66 has a three layer structure formed by laminating a first surface layer 68 on the outer side of the underlying layer 64, then a second surface layer 70 on the first surface layer 68, and then an outermost surface layer 72 on the outer side of the second surface layer 70.

The first surface layer 68 contains palladium (Pd) or a Pd alloy as a principal ingredient. As an example, in this embodiment, the first surface layer 68 contains a Pd—Ni alloy, made of Pd and Ni, as a principal ingredient. In the Pd—Ni alloy, the weight ratio of Pd is greater than that of Ni so as to facilitate Sn contained in each connection terminal 30 of the IC package 10 to dissolve and diffuse into the corresponding first surface layer 68 to a desired degree. For example, the first surface layer 68 contains 60 to 90 weight % of Pd and 40 to 10 weight % of Ni.

In order to provide the first surface layer 68 with a function of allowing dissolution and diffusion of Sn therein, the first surface layer 68 needs to have a thickness of 0.1 μm or more. The thickness of the first surface layer 68 may be 0.5 μm so as to ensure longer diffusion duration of Sn, or may be 5 μm or less so as to prevent cracks in the first surface layer 68.

The material for the first surface layer 68 is not limited to a Pd—Ni alloy. The first surface layer 68 has only to be made of a material that allows dissolution and diffusion of Sn therein upon application of heat at a diffusion rate of Sn which is lower than that in Pd. The first surface layer 68 may be a Pd—Co alloy, which contains Pd and cobalt (Co). In the Pd—Co alloy as well, the weight ratio of Pd is greater than that of Co so as to facilitate Sn in each connection terminal 30 of the IC package 10 to dissolve and diffuse into the corresponding first surface layer 68 to a desired degree. For example, the first surface layer 68 contains 90 weight % of Pd and 10 weight % of Co.

The second surface layer 70 contains, as a principal ingredient, Ni or a Ni alloy that is alloyable with Sn and allows dissolution and diffusion of Sn therein upon application of heat at a diffusion rate of Sn which is lower than that in Ag or in the first surface layer 68. As an example, in this embodiment, the second surface layer 70 is made of Ni. In order to delay diffusion of Sn into the first surface layer 68, the second surface layer 70 needs to have a thickness of 0.1 μm or more. The diffusion rate of Sn into the first surface layer 68 depends on the atmospheric temperature around the contact pin 32. The second surface layer 70 is formed on the first surface layer 68 by, for example, using plating or ion plating in the same manner as the above manufacturing methods of the first surface layer 68.

The outermost surface layer 72 is made of an electrical contact material (such as gold, silver, or palladium), functioning as an electrical contact between the outermost surface layer 72 and the corresponding connection terminal 30 of the IC package 10. The outermost surface layer 72 prevents or reduces the formation of an oxide film on the surface of the second surface layer 70, thereby facilitating diffusion of Sn from the connection terminal 30 of the IC package 10 to the contact pin 32 to some extent. The outermost surface layer 72 is formed in the same manner as the first surface layer 68 described above.

Assume here the case in which the second surface layer 70 is formed by Ni plating and the outermost surface layer 72 is omitted, for example. In such a case, Sn in the connection terminal 30 is less likely to dissolve into the second surface layer 70, which is formed by Ni plating. As a result, Sn accumulates to form an oxide film on the surface of the second surface layer 70 and constitutes an electrical insulator. This rapidly increases the electrical resistance between the connection terminal 30 of the IC package 10 and the contact pin 32. In contrast, when the outermost surface layer 72 is formed, Sn diffuses into the outermost surface layer 72 and is less likely to form an oxide film. Accordingly, the formation of the outermost surface layer 72 significantly reduces the probability of a rapid increase in the electrical resistance.

When used for burn-in tests conducted on the IC package 10 at higher test temperatures (at 200° C. or higher), the contact pins 32 and the IC socket 12 as described above are usable for a greater number of the burn-in tests than conventional until the underlying layer is exposed even though each contact pin 32 has a limited plated surface thickness. The reason for this will be described below.

Recently, the IC package 10 has been required to withstand usage environments involving higher temperature conditions such as in a control unit located in an engine compartment. In line with this trend, the test temperatures set in burn-in tests also tend to be higher (150° C. or higher, for example). When a burn-in test is conducted at a higher test temperature, tin contained in each connection terminal 30 of the IC package 10 dissolves and diffuses with higher rate into the plated metal layer formed on the surface of the corresponding contact pin of the IC socket, thus forming an alloy along the interface with higher rate. Here, when the IC package 10 is taken out of the IC socket with the connection terminal 30 adhered to the contact pin, fracture occurs in such an alloy layer formed along the interface between the plated metal layer of the contact pin and the connection terminal of the IC package, and the plated metal layer partially peels off with the connection terminal 30. Thus, when the test temperature becomes higher and the rate of alloying increases, an alloy layer is formed at a higher rate and the plated metal layer is reduced more quickly.

Figure 11:
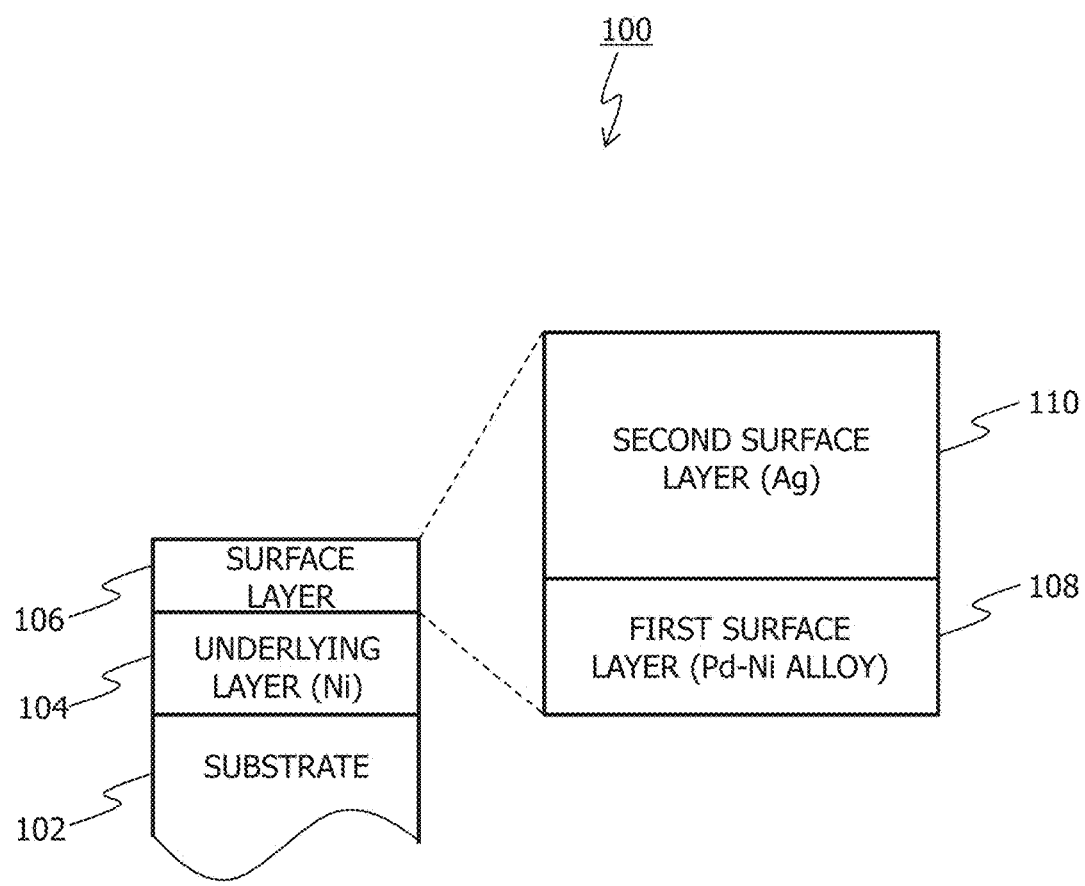
FIG. 11 is a schematic for illustrating the layer structure of a conventional electrical contact terminal.

In consideration of the fact that the test temperatures set in performance tests that are conducted on the IC package 10 tend to be higher (150° C. or higher, for example), a conventional contact pin 100 has a layer structure as shown in FIG. 11, including a substrate 102, an underlying layer 104, and a surface layer 106 which includes a first surface layer 108 and a second surface layer 110. The underlying layer 104 is formed on the surface of the substrate 102 by Ni plating, and the first surface layer 108 is then formed on the underlying layer 104 by Pd—Ni alloy plating. After that, the second surface layer 110, serving as the outermost surface layer, is formed on the first surface layer 108 by silver (Ag) plating. Here, the diffusion rate of Sn in the second surface layer 110, formed by Ag plating, is lower than that in the first surface layer 108.

In the conventional contact pin 100 as described above, when Sn contained in each connection terminal 30 of the IC package 10 dissolves and diffuses into the plated metal layer of the corresponding contact pin 100, only an extremely thin Ag—Sn alloy layer is formed at an initial stage along the interface between the plated metal layer of the contact pin and the connection terminal 30 of the IC package 10. Accordingly, such a contact pin 100 can minimize the portion of the plated metal layer that peels off with the connection terminal 30 along with the fracture of the Ag—Sn alloy layer when the IC package 10 is taken out of the IC socket. This delays diffusion of Sn into the plated Pd—Ni alloy layer, located further inside as the first surface layer 108, thus reducing the rate of reduction of the plated Pd—Ni alloy layer that is caused when the plated Pd—Ni alloy layer is partially alloyed with Sn and peels off with the connection terminal 30 of the IC package 10.

However, when the test temperatures set in performance tests that are conducted on the IC package 10 are even higher (200° C. or higher, for example), the Ag—Sn alloy layer is formed at a higher rate along the interface between the second surface layer 110 of contact pin 100 and the connection terminal 30 of the IC package 10. Thus, a larger portion of the plated Ag layer of the IC package 10 is likely to peel off with the connection terminal 30. The plated Ag layer delays diffusion of Sn into the plated Pd—Ni alloy layer. Accordingly, faster reduction of the plated Ag layer causes faster diffusion of Sn into the plated Pd—Ni alloy layer. As a result, the plated Pd—Ni alloy layer tends to reduce more quickly, and the underlying plated Ni layer may be exposed sooner.

For this, it is conceivable to greatly increase the thickness of the plated Ag layer, i.e., the second surface layer 110 so as to make the contact pin 100 usable for a greater number of tests until the plated Ag layer is completely removed. However, such a solution is not preferable since it affects the size of the contact pin 100, thus affecting its fitting to the socket main body 14.

In view of this, as shown in FIG. 7, the contact pin 32 according to the present embodiment is characterized by including the second surface layer 70, which contains Ni as a principal ingredient, in place of the second surface layer 110, which is formed by Ag plating in the conventional contact pin 100. Instead of Ni, the second surface layer 70 may contain, as a principal ingredient, a Ni alloy that is alloyable with Sn and allows dissolution and diffusion of Sn therein upon application of heat at a diffusion rate of Sn which is lower than that in Ag or in the first surface layer 68.

In the contact pin 32 according to this embodiment, the second surface layer 70, made of Ni or the like, delays diffusion of Sn from the connection terminal 30 of the IC package 10 into the contact pin 32 more greatly than the second surface layer 110, made of Ag, in the conventional contact pin 100. Thus, when used for performance tests conducted on the IC package 10 at higher test temperatures (200° C. or higher, for example), the contact pin 32 is usable for a greater number of performance tests until the underlying layer 64 is exposed than the conventional contact pin 100 is usable until the underlying layer 104 is exposed, given substantially the same plated surface thickness.

When the underlying layer 64, made of Ni, is exposed, Sn from the connection terminal 30 either accumulates to form an oxide film on the surface of the underlying layer 64, or diffuses into the underlying layer 64 to form an alloy layer. The formation of such an oxide film will rapidly increase the electrical resistance between the connection terminal 30 of the IC package 10 and the contact pin 32. On the other hand, the formation of such an alloy layer will cause the underlying layer 64 to partially peel off with the connection terminal 30 of the IC package 10. Thus, the fact that the contact pin 32 is usable for a greater number of tests until the underlying layer 64 is exposed means an increase in the service life of the IC socket 12.

Next, a first evaluation test to confirm the effects of the electrical contact terminals (contact pins) and electronic component socket (IC socket) according to the first embodiment of the present invention will be described.

In the first evaluation test, the state of alloying at a portion corresponding to the interface region of the first contact portion 42 against the connection terminal 30 was compared between a conventional contact pin and the contact pin according to this embodiment. The conventional contact pin includes a plated Pd—Ni layer as the first surface layer and a plated Ag layer as the second surface layer. The contact pin according to this embodiment (hereafter referred to as "first improved contact pin") includes a plated Pd—Ni alloy layer as the first surface layer and a plated Ni layer as the second surface layer.

(1) Specifications of Tested IC Sockets

One IC socket having the conventional contact pins attached thereto (hereafter referred to as "conventional IC socket") and one IC socket having the first improved contact pins attached thereto (hereafter referred to as "first improved IC socket") were prepared. These IC sockets had the same configuration.

In each of the conventional and first improved contact pins, the substrate was made of a Be—Cu alloy.

The conventional contact pin, which includes a substrate, an underlying layer, and first and second surface layers, was prepared by forming the underlying layer on the substrate by Ni plating with a thickness of 2 to 3 μm, then the first surface layer on the underlying layer by Pd—Ni alloy plating with a thickness of 1 μm, and then the second surface layer on the first surface layer by Ag plating with a thickness of 5 μm.

The first improved contact pin, which includes a substrate, an underlying layer, and first, second and outermost surface layers, was prepared by forming the underlying layer on the substrate by Ni plating with a thickness of 2 to 3 μm, then the first surface layer on the underlying layer by Pd—Ni alloy plating with a thickness of 0.5 μm, then the second surface layer on the first surface layer by Ni plating with a thickness of 0.5 μm, and then the outermost surface layer on the second surface layer by Au plating with a thickness of 0.5 μm.

(2) Specifications of Connection Terminals of IC Packages Used in Evaluation Test An IC package having connection terminals made of a Sn-3Ag-0.5Cu alloy was accommodated in each of the conventional and first improved IC sockets.

(3) Test Method

The first evaluation test is conducted according to the following procedure: First, an unused IC packages was fitted in each of the two IC sockets, i.e., the conventional IC socket and the first improved IC socket. Then, with this state maintained, the ambient temperature around each IC socket was increased and maintained at 200° C. for 24 hours. After that, the ambient temperature was lowered to room temperature, and the IC package was then taken out of the IC socket. Twenty cycles, each consisting of the above steps, were conducted successively. After completion of these twenty cycles, the cross section of a portion, corresponding to the interface region, against the connection terminal 30, of the first contact portion 42 of each contact pin was photographed using a microscope so as to facilitate observation of the state of alloying due to the contact between the contact pin of the IC socket and the connection terminal of the IC package.

(4) Results

Figure 12:
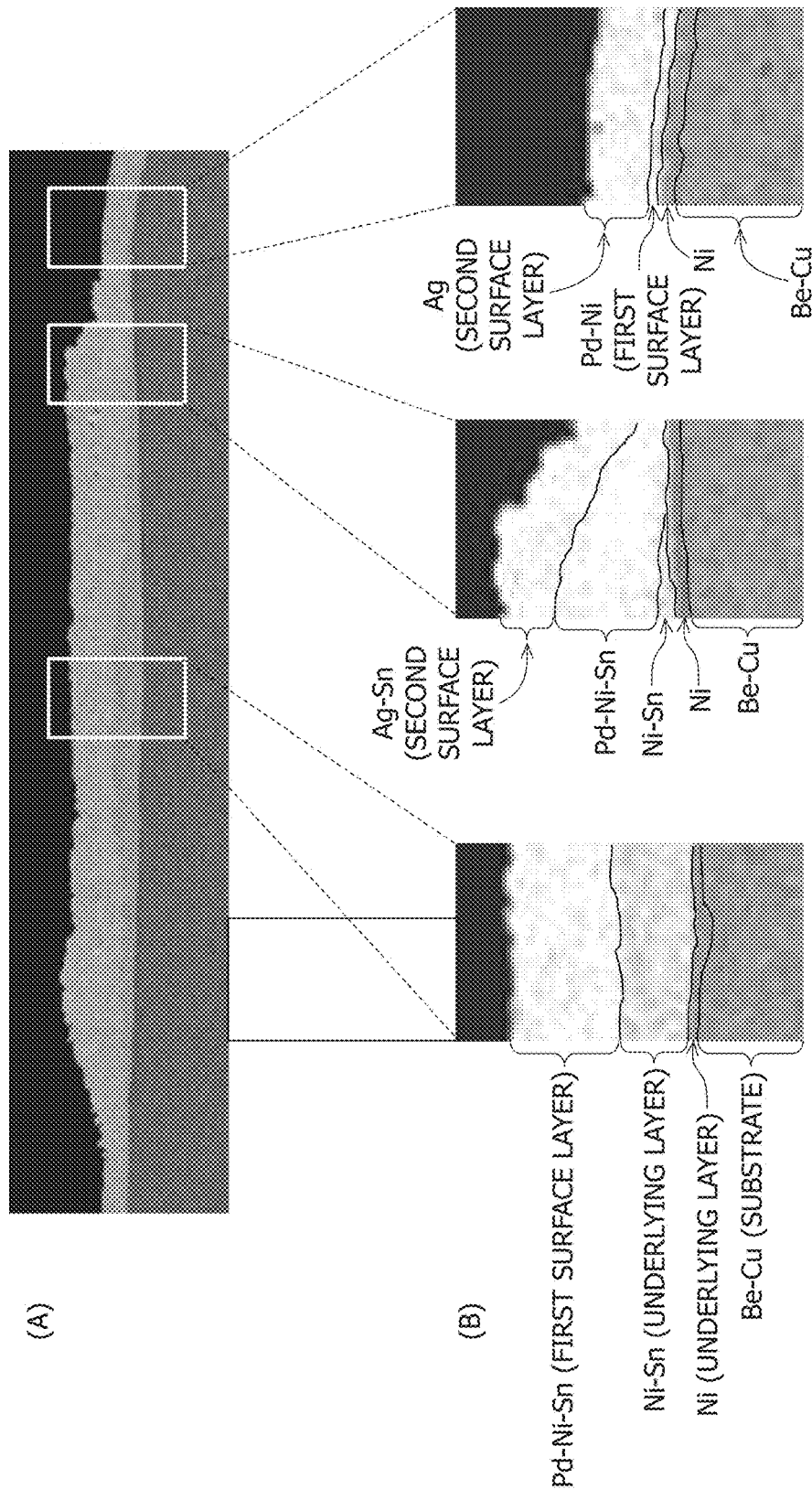
FIG. 12 shows photographs of the cross section of the conventional electrical contact terminal after burn-in tests: (A) of FIG. 12 covers the entire interface area; and (B) of FIG. 12 includes enlarged photographs of portions in (A) of FIG. 12.

FIG. 12 shows the state of alloying in the conventional contact pin after the first evaluation test was completed. It was confirmed that, in a portion next to the contact area in which the conventional contact pin was in contact with the corresponding connection terminal of the IC package (corresponding to the rightmost one of the three pictures of (B) of FIG. 12) as well as in an end portion of the contact area (corresponding to the center one of the three pictures of (B) of FIG. 12), the plated Ag layer, i.e., the second surface layer, remained preserved or was changed into an Ag—Sn alloy layer by diffusion of Sn from the connection terminal of the IC package, so that the Ag—Sn alloy layer remained as the outermost surface layer.

However, in a center portion of the contact area (corresponding to the leftmost one of the three pictures of (B) of FIG. 12), it was confirmed that there remained neither the plated Ag layer, i.e., the second surface layer, nor an Ag—Sn alloy layer into which the plated Ag layer is changed, which means that the plated Ag layer substantially completely peeled off with the connection terminal of the IC package.

Figure 8:
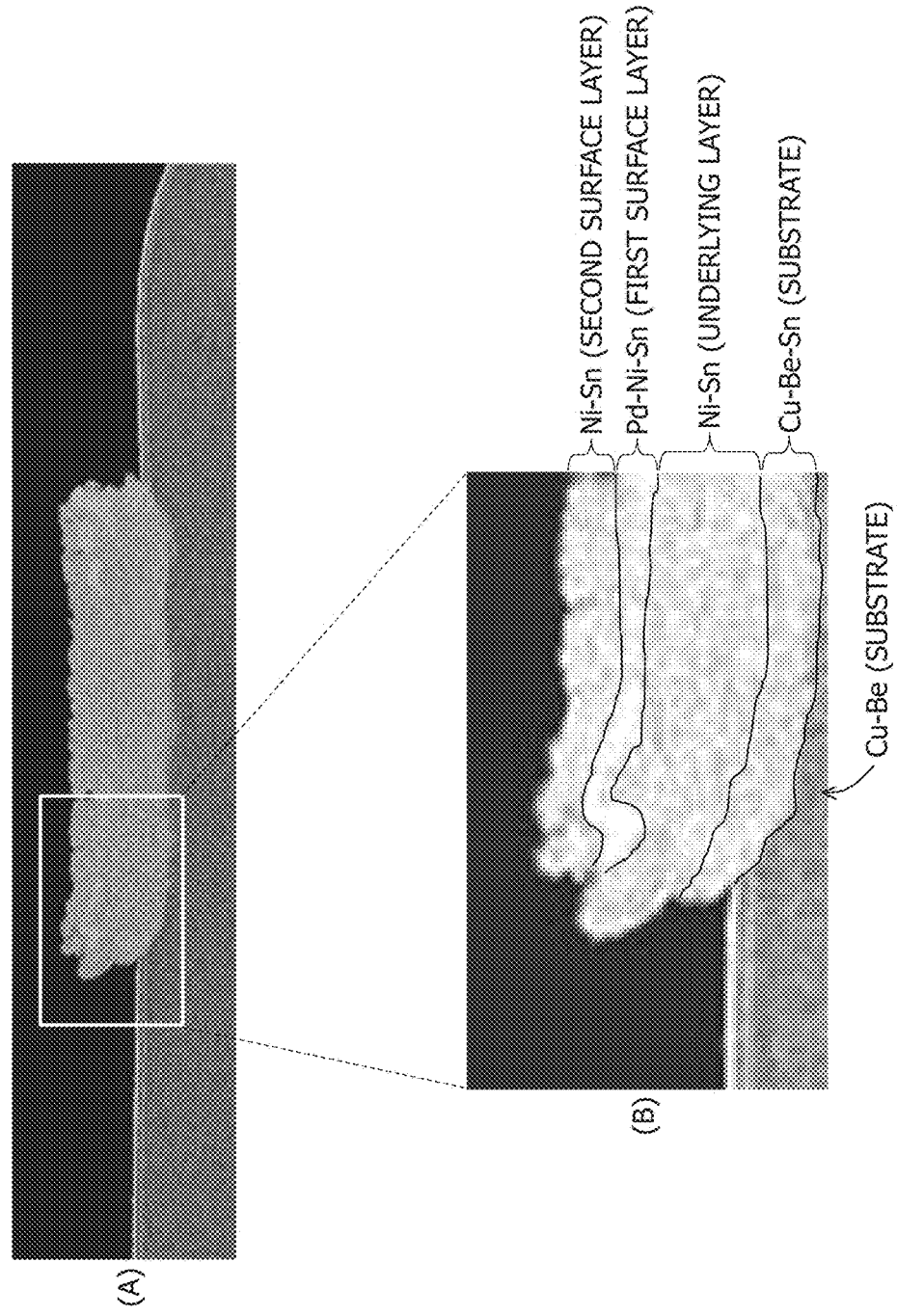
FIG. 8 shows photographs of the cross section of the electrical contact terminal according to the first embodiment after burn-in tests: (A) of FIG. 8 covers the entire interface area; and (B) of FIG. 8 includes enlarged photographs of portions in (A) of FIG. 8.

FIG. 8 shows the state of alloying in the first improved contact pin after the first evaluation test was completed. It was confirmed that, as shown in (B) of FIG. 8, in a region extending from an end portion to a center portion of the contact area in which the first improved contact pin was in contact with the corresponding connection terminal of the IC package, the plated Au layer serving as the outermost surface layer substantially completely peeled off with the connection terminal of the IC package, but the plated Ni layer serving as the second surface layer was changed into a Ni—Sn alloy layer by diffusion of Sn from the connection terminal of the IC package, so that the Ni—Sn alloy layer remained as the outermost surface layer.

Based on the above results, it has been confirmed that the reduction of the plated Ni layer serving as the second surface layer in the first improved contact pin is slower than the reduction of the plated Ag layer serving as the second surface layer in the conventional contact pin. Even taking into account the fact that the first improved contact pin includes the outermost surface layer formed by Au plating with a thickness of 0.5 μm, there is no doubt about this conclusion because the diffusion of Sn in the plated Au layer is faster than the diffusion of Sn in the plated Ag layer, i.e., the second surface layer in the conventional contact pin, and the plated Ag layer serving as the second surface layer in the conventional contact pin, has a thickness of 5 μm, which is ten-fold greater than the thickness of the plated Au layer serving as the outermost surface layer of the first improved contact pin. Thus, it has been confirmed that the first improved contact pin is usable for a greater number of tests than the conventional contact pin until the plated Ni layer serving as the underlying layer is exposed.

Furthermore, it is expected that, if the plated Ag layer serving as the second surface layer of the conventional contact pin had a thickness substantially the same as that of the plated Ni layer serving as the second surface layer of the first improved contact pin, there would be a still greater difference between the first improved contact pin and the conventional contact pin in the number of tests for which a single contact pin is usable until the plated Ni layer serving as the underlying layer is exposed.

Next, electrical contact terminals (contact pins) and an electronic component socket (IC socket) using the electrical contact terminals according to a second embodiment of the present invention will be described. The second embodiment differs from the first embodiment only in the layer structure of each contact pin. Thus, in the following description, the same reference numerals are given to the same components as those in the contact pins and IC socket according to the first embodiment, and description thereof will be omitted as much as possible.

Figure 9:
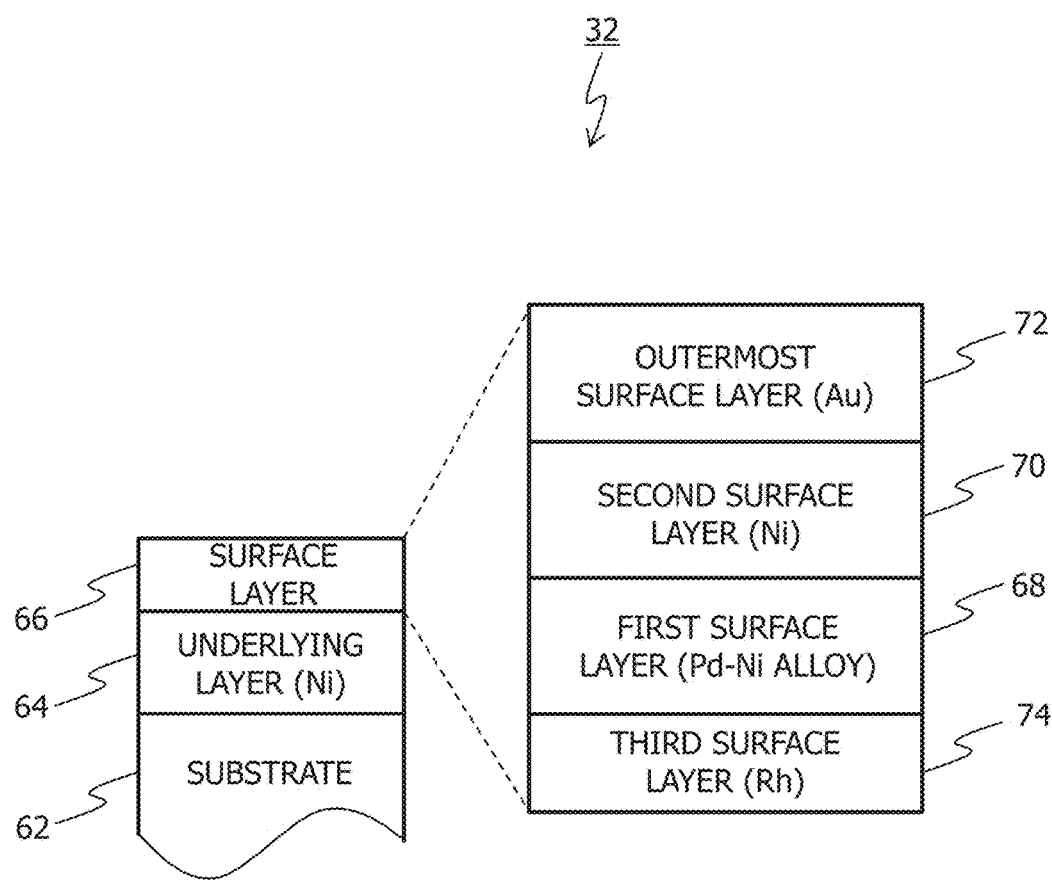
FIG. 9 is a schematic for illustrating the layer structure of the electrical contact terminal according to a second embodiment of the present invention.

FIG. 9 shows the layer structure of the contact pin 32 according to the second embodiment.

The contact pin 32 further includes a third surface layer 74 between the first surface layer 68 and the underlying layer 64.

The third surface layer 74 is made of a material that is alloyable with Sn and allows dissolution and diffusion of Sn therein upon application of heat at a diffusion rate of Sn which is lower than that in Ni. Such materials include rhodium (Rh), chromium, ruthenium, and indium. Alternatively, the third surface layer 74 may contain an alloy of palladium and ruthenium that has an electronic state equivalent to that of rhodium. This palladium-ruthenium alloy is disclosed, for example, in "the Nihon Keizai Shimbun (newspaper), 'Kyoto University Developed Alloy Having the Same Property as Rhodium', online, Internet URL: http://www.nikkei.com/article/DGXNASFK2302H_T20C-14A1000000/ (accessed Aug. 3, 2015)". As an example, the third surface layer 74 is made of Rh in this embodiment. The third surface layer 74 is formed by, for example, using plating or ion plating in the same manner as the above manufacturing method of the first surface layer 68.

Here, the results of the above first evaluation test for the first improved contact pin will be considered. As shown in (B) of FIG. 8, Sn from the connection terminal of the IC package penetrated not only to the plated Ni layer serving as the underlying layer to form a Ni—Sn alloy, but also to the substrate, made of the Be—Cu alloy, to form a Cu—Be—Sn alloy. This is because, although Sn is less likely to diffuse into the plated Ni layer serving as the underlying layer in testing environments with relatively low temperature, Sn is more likely to dissolve into the underlying layer to form an alloy in testing environments with higher test temperature (200° C. or higher, for example).

As a result of the dissolution of Sn into the plated Ni layer serving as the underlying layer, the resultant alloy rapidly expanded the underlying layer. Thus, the continuity of each layer was broken at such an expanded portion, and diffusion and alloying of Sn along the surface of the contact pin in the first and second surface layers were discontinued. Consequently, Sn from the connection terminal continued to diffuse into the expanded portion, thus further expanding the contact pin in a thickness direction.

In view of this, the contact pin 32 according to the second embodiment further includes the third surface layer 74 between the first surface layer 68 and the underlying layer 64 such that the third surface layer 74 can reduce the diffusion rate of Sn into the underlying layer 64 and suppress alloying with Sn in the underlying layer 64 to limit its expansion.

Next, a second evaluation test to confirm the effects of the electrical contact terminals (contact pins) and electronic component socket (IC socket) according to the second embodiment of the present invention will be described.

In the second evaluation test, the state of alloying at a portion corresponding to the interface region of the first contact portion 42 against the connection terminal 30 in the contact pin according to the second embodiment was observed. The contact pin according to the second embodiment (hereafter referred to as "second improved contact pin") includes a plated Pd—Ni alloy layer as the first surface layer, a plated Ni layer as the second surface layer, and a plated Rh layer as the third surface layer. Then, the evaluation test result for the second improved contact pin was compared with that for the first improved contact pin according to the first embodiment.

The first and second improved contact pins are the same in the substrate, underlying layer, first surface layer, second surface layer, and outermost surface layer. However, in the second improved contact pin, the third surface layer was additionally formed between the underlying layer and the first surface layer by Rh plating with a thickness of 0.1 μm. One IC socket having the second improved contact pins attached thereto (hereafter referred to as "second improved IC socket") was prepared. The first and second improved IC sockets had the same configuration. The specifications of each connection terminal of the IC package and the test method used in the evaluation test were the same as those for the first improved IC socket. After completion of the evaluation test, the cross section of a portion, corresponding to the interface region of the first contact portion 42 against the connection terminal 30, of the second improved contact pin was photographed using a microscope so as to facilitate observation of the state of alloying due to the contact between the second improved contact pin and the connection terminal of the IC package.

Figure 10:
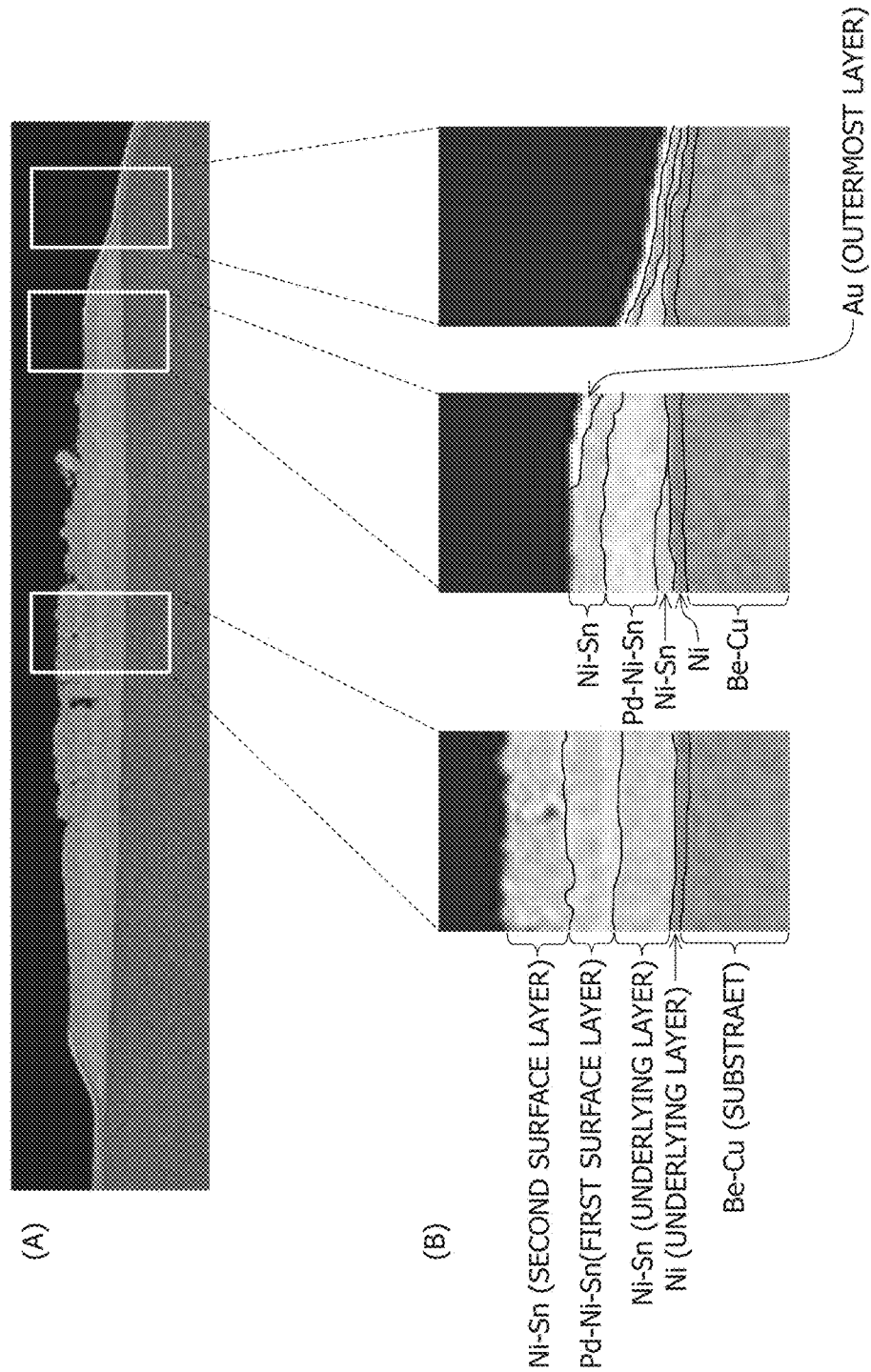
FIG. 10 shows photographs of the cross section of the electrical contact terminal according to the second embodiment after burn-in tests: (A) of FIG. 10 covers the entire interface area; and (B) of FIG. 10 includes enlarged photographs of portions in (A) of FIG. 10.

FIG. 10 shows the state of alloying in the second improved contact pin after the second evaluation test was completed. It was confirmed that in a center portion of the contact area in which the second improved contact pin was in contact with the corresponding connection terminal of the IC package (corresponding to the leftmost one of the three pictures of (B) of FIG. 10), the plated Au layer serving as the outermost surface layer substantially completely peeled off with the connection terminal of the IC package, but the plated Ni layer serving as the second surface layer was changed into a Ni—Sn alloy layer by diffusion of Sn from the connection terminal of the IC package, so that the Ni—Sn alloy layer remained as the outermost surface layer as in the results of the first evaluation test for the first improved contact pin.

The results of the second evaluation test show that Sn from the connection terminal penetrated to the plated Ni layer serving as the underlying layer to form a Ni—Sn alloy. However, as compared to the results of the first evaluation test for the first improved contact pin, the amount of an alloy of Ni and Sn in the plated Ni layer serving as the underlying layer 64 is reduced as is evident, for example, from the fact that no alloying occurs in some region within the underlying layer 64. In addition, in the results of the second evaluation test, no alloying of the Be—Cu alloy and Sn occurred in the substrate 62. Therefore, it was confirmed that the expansion of the underlying layer 64 was successfully prevented to some extent.

Furthermore, the results of the second evaluation test show that Sn from the connection terminal diffused not only into the second and first surface layers in the center portion of the contact area in which the second improved contact pin was in contact with the corresponding connection terminal of the IC package, but also into the second and first surface layers in an end portion of the contact area (corresponding to the center one of the three pictures of (B) of FIG. 12) and in a portion next to the contact area (corresponding to the rightmost one of the three pictures of (B) of FIG. 10). Thus, it was confirmed that Sn from the connection terminal diffused and was alloyed along the surface of the contact pin.

The above embodiments may be modified in the following manner as long as such modification will not excessively increase or reduce the diffusion rate of Sn from the connection terminals 30 of the IC package 10 to the contact pins 32 during performance tests conducted on the IC package 10 at higher test temperatures (200° C. or higher, for example). Specifically, one or more layers may be added between the second surface layer 70 and the outermost surface layer 72, between the first surface layer 68 and the underlying layer 64, and/or between the first surface layer 68 and the second surface layer 70.

Furthermore, although the outermost surface layer 72 is formed on the outer side of the second surface layer 70 in the above embodiments, the outermost surface layer 72 may be omitted, depending on the test temperature. This is because, at a higher test temperature, Sn from the connection terminals 30 is more likely to dissolve and diffuse into the second surface layer 70 and be alloyed therein rather than accumulating to form an oxide film on the surface of the second surface layer 70, even without the outermost surface layer 72.

Furthermore, although the above embodiments have been described using the IC socket 12, which is an open-top socket, as an example of the electronic component socket for accommodating the IC package 10, which is an electronic component, the present invention is not limited to this. A different type of IC socket may be used as long as the IC socket includes a socket main body for accommodating the IC package 10 and electrical contact terminals that are provided to the socket main body so as to be in contact with the connection terminals 30 of the IC package 10 accommodated in the socket main body, and each electrical contact terminal has the same layer structure as that of each contact pin 32 according to either of the above embodiments.

Although the electrical contact terminals have been described using, as an example, the contact pins 32 each including the first and second contact portions 42, 46 to clamp the corresponding connection terminal 30 of the IC package 10, the present invention is not limited to this. The electrical contact terminals have only to be in contact with the connection terminals of the electronic component.

Although it has been described that the insertion or extraction direction of the IC package 10 into/from the IC socket 12 is vertical in the above embodiments, this is merely for convenience and the present invention is not limited to this. Any position of the IC socket 12 may be freely employed. For example, the insertion or extraction direction of the IC package 10 may be horizontal.

REFERENCE SYMBOL LIST

10 IC package
12 IC socket
14 socket main body
30 connection terminal
32 contact pin
42 first contact portion
46 second contact portion
60 IC package insertion slot
62 substrate
64 underlying layer
66 surface layer
68 first surface layer
70 second surface layer
72 outermost surface layer
74 third surface layer

The invention claimed is:

1. An electrical contact terminal including a conductive substrate and a plurality of layers laminated on a surface of the substrate, the plurality of layers comprising:
    a first surface layer that contains palladium or a palladium alloy as a principal ingredient; and
    a second surface layer formed on an opposite side of the first surface layer from the substrate, the second surface layer containing, as a principal ingredient, a nickel alloy that is alloyable with tin and allows dissolution and diffusion of tin therein upon application of heat at a diffusion rate of tin which is lower than that in silver or in the first surface layer.

2. An electronic component socket comprising:
    a socket main body for accommodating an electronic component including a connection terminal that contains tin; and
    an electrical contact terminal according to claim 1 that is provided to the socket main body so as to be in contact with the connection terminal of the electronic component accommodated in the socket main body.

3. An electrical contact terminal including a conductive substrate and a plurality of layers laminated on a surface of the substrate, the plurality of layers comprising:
    a first surface layer that contains palladium or a palladium alloy as a principal ingredient;
    a second surface layer formed on an opposite side of the first surface layer from the substrate, the second surface layer containing, as a principal ingredient, nickel or a nickel alloy that is alloyable with tin and allows dissolution and diffusion of tin therein upon application of heat at a diffusion rate of tin which is lower than that in silver or in the first surface layer;
    an underlying layer formed between the substrate and the first surface layer, the underlying layer containing nickel as a principal ingredient; and
    a third surface layer formed between the underlying layer and the first surface layer, the third surface layer containing a material that is alloyable with tin and allows dissolution and diffusion of tin therein upon application of heat at a diffusion rate of tin which is lower than that in nickel.

4. The electrical contact terminal according to claim 3, wherein the third surface layer contains rhodium as a principal ingredient.

5. An electronic component socket comprising:
    a socket main body for accommodating an electronic component including a connection terminal that contains tin; and
    an electrical contact terminal according to claim 4 that is provided to the socket main body so as to be in contact with the connection terminal of the electronic component accommodated in the socket main body.

6. The electrical contact terminal according to claim 3, wherein the third surface layer contains chromium as a principal ingredient.

7. An electronic component socket comprising:
a socket main body for accommodating an electronic component including a connection terminal that contains tin; and
an electrical contact terminal according to claim 6 that is provided to the socket main body so as to be in contact with the connection terminal of the electronic component accommodated in the socket main body.

8. The electrical contact terminal according to claim 3, wherein the third surface layer contains ruthenium as a principal ingredient.

9. An electronic component socket comprising:
a socket main body for accommodating an electronic component including a connection terminal that contains tin; and
an electrical contact terminal according to claim 8 that is provided to the socket main body so as to be in contact with the connection terminal of the electronic component accommodated in the socket main body.

10. The electrical contact terminal according to claim 3, wherein the third surface layer contains indium as a principal ingredient.

11. An electronic component socket comprising:
a socket main body for accommodating an electronic component including a connection terminal that contains tin; and
an electrical contact terminal according to claim 10 that is provided to the socket main body so as to be in contact with the connection terminal of the electronic component accommodated in the socket main body.

12. The electrical contact terminal according to claim 3, wherein the third surface layer contains an alloy of palladium and ruthenium as a principal ingredient.

13. An electronic component socket comprising:
a socket main body for accommodating an electronic component including a connection terminal that contains tin; and
an electrical contact terminal according to claim 12 that is provided to the socket main body so as to be in contact with the connection terminal of the electronic component accommodated in the socket main body.

14. An electronic component socket comprising:
a socket main body for accommodating an electronic component including a connection terminal that contains tin; and
an electrical contact terminal according to claim 3 that is provided to the socket main body so as to be in contact with the connection terminal of the electronic component accommodated in the socket main body.

15. An electrical contact terminal including a conductive substrate and a plurality of layers laminated on a surface of the substrate, the plurality of layers comprising:
a first surface layer that contains palladium or a palladium alloy as a principal ingredient;
a second surface layer formed on an opposite side of the first surface layer from the substrate, the second surface layer containing, as a principal ingredient, nickel or a nickel alloy that is alloyable with tin and allows dissolution and diffusion of tin therein upon application of heat at a diffusion rate of tin which is lower than that in silver or in the first surface layer; and
an outermost surface layer formed on an opposite side of the second surface layer from the first surface layer, the outermost surface layer containing an electrical contact material that includes gold, silver, or palladium as a principal ingredient.

16. An electronic component socket comprising:
a socket main body for accommodating an electronic component including a connection terminal that contains tin; and
an electrical contact terminal according to claim 15 that is provided to the socket main body so as to be in contact with the connection terminal of the electronic component accommodated in the socket main body.

* * * * *